United States Patent
Seo et al.

(10) Patent No.: US 7,452,248 B2
(45) Date of Patent: Nov. 18, 2008

(54) INTERCONNECTION DEVICE FOR A PRINTED CIRCUIT BOARD, A METHOD OF MANUFACTURING THE SAME, AND AN INTERCONNECTION ASSEMBLY HAVING THE SAME

(75) Inventors: Dongweon Seo, Euiwang (KR); Juntae Hwang, Seoul (KR)

(73) Assignees: Oug-Ki Lee, Seoul (KR); Phicom Corporation, Seoul (KR)

( * ) Notice: Subject to any disclaimer, the term of this patent is extended or adjusted under 35 U.S.C. 154(b) by 0 days.

(21) Appl. No.: 11/933,735

(22) Filed: Nov. 1, 2007

(65) Prior Publication Data

US 2008/0057745 A1   Mar. 6, 2008

Related U.S. Application Data

(62) Division of application No. 10/547,231, filed as application No. PCT/KR03/01413 on Jul. 16, 2003, now Pat. No. 7,306,493.

(30) Foreign Application Priority Data

Feb. 28, 2003   (KR)   ............... 10-2003-0012673

(51) Int. Cl.
   *H01R 13/42*   (2006.01)
(52) U.S. Cl. ............................................... 439/751
(58) Field of Classification Search ................ 439/751, 439/70, 71, 82, 84, 66
   See application file for complete search history.

(56) References Cited

U.S. PATENT DOCUMENTS 4,186,982 A * 2/1980 Cobaugh et al. ............... 439/82
4,357,062 A * 11/1982 Everett .......................... 439/54
4,508,405 A   4/1985 Damon et al.
4,724,383 A * 2/1988 Hart ............................ 324/754
4,806,104 A * 2/1989 Cabourne ...................... 439/66

(Continued)

FOREIGN PATENT DOCUMENTS

EP   0 295 914   12/1988

(Continued)

OTHER PUBLICATIONS

PCT/KR2003/001413 International Preliminary Examination Report dated Jul. 1, 2005.

*Primary Examiner*—Tulsidas C. Patel
*Assistant Examiner*—Vladimir Imas
(74) *Attorney, Agent, or Firm*—Daly, Crowley, Mofford & Durkee, LLP

(57) ABSTRACT

An interconnect assembly including a contact, a first guide film, a space transformer, a second guide film, and an interconnect device including a second contact section having an O-ring-like shape to be inserted into the contact hole by an interference fit, a support section having an engaging protrusion in a predetermined portion and connected to the second contact section in an integrated manner to be inserted into the inside of the first guide opening, a connecting section having an O-ring-like shape of which one side is opened and connected to the support section in an integrated manner thereby being placed between the first guide film and the second guide film, and a first contact section connected to the connecting section in an integrated manner for making contact with the second contact section through the second guide opening.

5 Claims, 5 Drawing Sheets

U.S. PATENT DOCUMENTS

| | | | |
|---|---|---|---|
| 4,857,018 A * | 8/1989 | Pickles | 439/751 |
| 4,871,317 A * | 10/1989 | Jones | 439/68 |
| 4,887,544 A * | 12/1989 | Nunally | 118/50 |
| 4,899,106 A * | 2/1990 | Ogura | 324/754 |
| 4,904,212 A * | 2/1990 | Durbin et al. | 439/751 |
| 5,006,922 A * | 4/1991 | McShane et al. | 257/697 |
| 5,132,879 A * | 7/1992 | Chang et al. | 361/784 |
| 5,139,446 A * | 8/1992 | Costello et al. | 439/751 |
| 5,199,889 A | 4/1993 | McDevitt, Jr. | |
| 5,772,451 A * | 6/1998 | Dozier et al. | 439/70 |
| 5,952,843 A * | 9/1999 | Vinh | 324/761 |
| 6,139,336 A * | 10/2000 | Olson | 439/83 |
| 6,155,887 A | 12/2000 | Cuff et al. | |
| 6,206,735 B1 | 3/2001 | Zanolli | |
| 6,309,259 B1 * | 10/2001 | Yamashita | 439/742 |
| 6,312,296 B1 * | 11/2001 | Jones | 439/751 |
| 6,325,644 B1 * | 12/2001 | Lemke et al. | 439/83 |
| 6,343,940 B1 | 2/2002 | Khoury et al. | |
| 6,352,436 B1 | 3/2002 | Howard | |
| 6,358,068 B1 * | 3/2002 | Houtz | 439/83 |
| 6,367,763 B1 * | 4/2002 | Pfaff | 248/618 |
| 6,428,329 B2 | 8/2002 | Orui et al. | |
| 6,450,839 B1 | 9/2002 | Min et al. | |
| 6,592,382 B2 * | 7/2003 | Wurster | 439/82 |
| 6,664,484 B2 * | 12/2003 | Haba et al. | 174/261 |
| 6,741,085 B1 | 5/2004 | Khandros et al. | |
| 6,764,869 B2 * | 7/2004 | Eldridge | 438/15 |
| 6,811,407 B2 | 11/2004 | Watanabe | |
| 6,866,523 B2 * | 3/2005 | Yamashita | 439/79 |
| 6,917,102 B2 | 7/2005 | Zhou et al. | |
| 7,044,807 B2 * | 5/2006 | Furuno et al. | 439/751 |
| 7,059,047 B2 * | 6/2006 | Dozier et al. | 29/845 |

FOREIGN PATENT DOCUMENTS

| | | |
|---|---|---|
| FR | 2 680 284 | 2/1993 |

* cited by examiner

INTERCONNECTION DEVICE FOR A PRINTED CIRCUIT BOARD, A METHOD OF MANUFACTURING THE SAME, AND AN INTERCONNECTION ASSEMBLY HAVING THE SAME

CROSS-REFERENCE TO RELATED APPLICATIONS

This application is a Divisional Application of U.S. patent application Ser. No. 10/547,231 filed on Aug. 26, 2005 now U.S. Pat. No. 7,306,493, which is a National Stage application under 35 U.S.C. §371 and claims the benefit of International Application No. PCT/KR2003/001413, filed on Jul. 16, 2003, published in the English language on Sep. 10, 2004 as International Publication Number WO 2004/077623 A1, which claims priority to Korean Application No. 10-2003-0012673, filed on Feb. 28, 2003, all of which are hereby incorporated herein by reference.

FIELD OF THE INVENTION

The present invention relates to an interconnect device for a printed circuit board, a method of manufacturing the same, and an interconnect assembly having the same, and more specifically to an interconnect device for a printed circuit board which holds resilient forces as well as electrically interconnects an upper substrate with a lower substrate, a method of manufacturing the same and an interconnect assembly having the same.

BACKGROUND OF THE INVENTION

Typically, a semiconductor device is implemented on a wafer by repeating wafer processes such as an oxidation process, a diffusion process, an etching process, and a metallization process, and then slicing and packaging processes are performed to make a shipment. In addition, the semiconductor device implemented on the wafer is subject to a probing test for verifying whether it is acceptable or not after completing the wafer processes but before slicing them.

In such a probing test, predetermined electrical signals are applied from a test equipment through probe tips of a probe card coupled with electrode pads in the chips on the wafer and then the corresponding output electrical signals are received to test whether the chips on the wafer are acceptable or not.

Also, in such a probing test for testing whether chips on the wafer are acceptable or not, it is typical to use a probe card which comprises probe tips corresponding to the lay-out of the probed (i.e., each of pads implemented on a semiconductor substrate).

As seen in Korean Patent Application No. 2001-0074710, in a conventional probe card assembly 500, a probe pin or a contact element 524 makes contact with the bonding pads 526 on the semiconductor wafer 508.

The probe card assembly includes several elements which are assembled together, including a probe card 502, an interposer 504, and a space transformer 506. The probe card 502 is typically a printed circuit board, which includes circuit traces to various electrical components, which are used in performing the electrical tests of the semiconductor die being probed.

Contact elements on the probe card 502 make contact with the bonding pads 526 through a series of intervening layers including the interposer 504 and the space transformer 506.

The interposer 504 provides for a resilient or spring-like positioning in the vertical or z direction in order to provide adequate contact for all contact elements at the bonding pads regardless of the length of the contact elements used on the intervening layers, such as the contact elements 524 which resemble springs. The space transformer 506 performs a pitch reduction and is also the substrate on which resilient contact elements are disposed.

In more detail, the interposer assembly 300 has a substrate 302 on which resilient contact elements are attached, including contact elements 312, 314, 316, and 318. Contact elements 312 and 316 are electrically coupled from one side of interposer 300 to the other side by a through connect 304A, and contact elements 314 and 318 are electrically coupled by a through connect 306A.

Accordingly, contact elements such as springs in the interposer 504 assembly 300 are attached to the substrate 302 by a wire boding process or the like. Therefore, a process of fabricating the assembly is very difficult and causes a lot of processing time losses.

Particularly, the wire bonding process for the resilient contact elements such as springs is performed two times for both top and bottom surfaces of the substrate 302. This makes the process more difficult and causes more processing time losses.

Along with the above problems, since the resilient contact elements such as springs are attached to both top and bottom surfaces of the substrate 302 by the wire bonding process or the like, the attached portions can be easily deteriorated. In addition, since the resilient contact elements such as springs are attached to both top and bottom surfaces of the substrate, the total path length of the electrical signal increases so that electrical noises can easily occur.

In addition, since the probe card assembly comprises an element, the interposer which includes the substrate, the total cost of manufacturing the probe card assembly increases.

SUMMARY OF THE INVENTION

Accordingly, an object of the present invention is to provide an interconnect device for a printed circuit board, a method of manufacturing the same, and an interconnect assembly having the same which are capable of omitting the wire bonding process for attaching the resilient contact elements such as springs to the substrate so as to solve related problems such as difficulties in the manufacturing processes caused by the bonding process.

Another object of the present invention is to provide an interconnect device for a printed circuit board, a method of manufacturing the same, and an interconnect assembly having the same which are capable of preventing deterioration of the substrate portions corresponding to the resilient contact elements such as springs and occurrence of electrical noises by reducing total path length of the electrical signal.

Still another object of the present invention is to provide an interconnect device for a printed circuit board, a method of manufacturing the same, and an interconnect assembly having the same which are capable of reducing the cost of manufacturing the entire probe card assembly by omitting the interposer and the substrate from the probe card assembly.

In order to achieve the above objects, the interconnect device 2 for a printed circuit board according to one aspect of the present invention comprises: a first contact section 10 having a bar-like shape for making contact with a second contact terminal 76 in a space transformer 52; a connecting section 12 having an O-ring-like shape of which one side is opened and connected to one end of the first contact section 10 in an integrated manner; a support section 14 having an engaging protrusion 14a in a predetermined portion and connected to one end of the connecting section 12 in an integrated manner; and a second contact section 16 having an O-ring-like shape and connected to one end of the support section 14 in an integrated manner, wherein the whole interconnect device is made up of an identical resilient material.

According to another aspect of the present invention, a method of manufacturing an interconnect device for a printed circuit board comprises steps of: forming a protective film pattern on a sacrificial substrate for forming an interconnect device including a first contact section 10 having a bar-like shape for making contact with a second contact terminal 76 in a space transformer, a connecting section 12 having an O-ring-like shape of which one side is opened and connected to one end of the first contact section 10 in an integrated manner, a support section 14 having an engaging protrusion in a predetermined portion and connected to one end of the connecting section 12 in an integrated manner, and a second contact section 16 having an O-ring-like shape and connected to one end of the support section 14 in an integrated manner; filling a conductive material 26 into the inside of the protective pattern 24; and removing the protective film pattern 24 and the sacrificial substrate 20 to finish the interconnect device.

According to still another aspect of the present invention, an interconnect assembly having an interconnect device for a printed circuit board comprises: a printed circuit board 40 including a contact hole 70 in which a conductive film 72 connected to an internal circuitry is formed on the inside wall; a first guide film 60 fixed on a bottom surface of the printed circuit board 40 and having a first guide opening 66 to open the contact hole 70; a space transformer having a second contact terminal 76 on a top portion and a bump 64 in the vicinity of the second contact terminal 76; a second guide film 62 fixed on the space transformer 52, supported by the bump 64, and having a second guide opening 68 to be related with the bump 64; and an interconnect device 2 including a second contact section having an O-ring-like shape to be inserted into the contact hole 70 by an interference fit, a support section having an engaging protrusion in a predetermined portion and connected to the second contact section in an integrated manner to be inserted into the inside of the first guide opening, a connecting section having an O-ring-like shape of which one side is opened and connected to the support section in an integrated manner thereby being placed between the first guide film and the second guide film, and a first contact section connected to the connecting section in an integrated manner for making contact with the second contact section 76 through the second guide opening.

BRIEF DESCRIPTION OF THE DRAWINGS

The above and other objects, advantages and features of the present invention will become apparent from the following description of preferred embodiments given in conjunction with the accompanying drawings, in which.

DETAILED DESCRIPTION OF THE PREFERRED EMBODIMENTS

Figure 1:
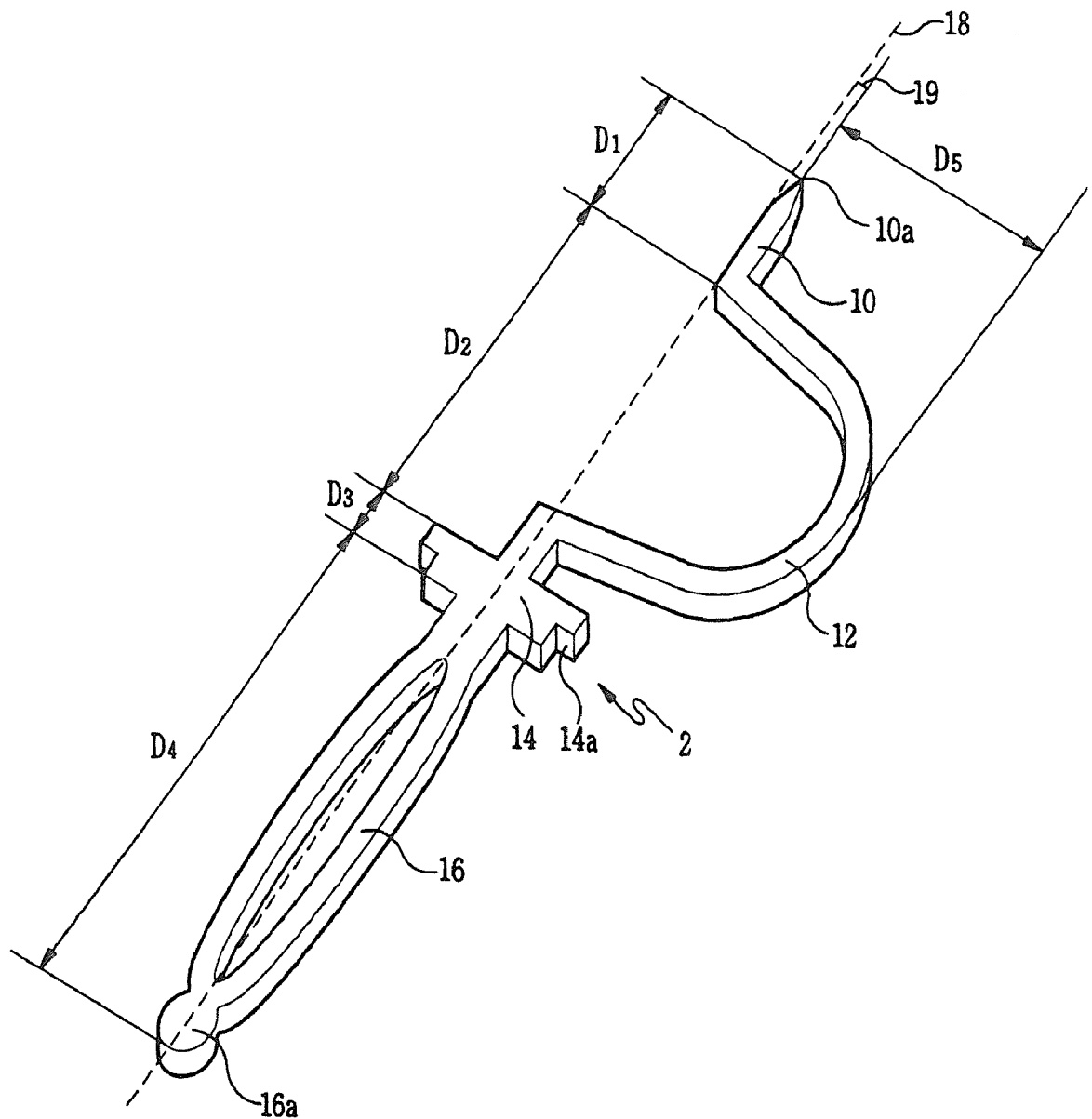
FIG. 1 is a perspective view of an interconnect device according to an embodiment of the present invention.

In order to achieve the above objects, the interconnect device 2 for a printed circuit board according to one aspect of the present invention comprises: a first contact section 10 having a bar-like shape for making contact with a second contact terminal 76 in a space transformer 52; a connecting section 12 having an O-ring-like shape of which one side is opened and connected to one end of the first contact section 10 in an integrated manner; a support section 14 having an engaging protrusion 14*a* in a predetermined portion and connected to one end of the connecting section 12 in an integrated manner; and a second contact section 16 having an O-ring-like shape and connected to one end of the support section 14 in an integrated manner, wherein the whole interconnect device is made up of an identical resilient material.

Now, each element of the interconnect device 2 will be described in detail with reference to the accompanying drawings.

First, the interconnect device 2 is made up of a conductive material such as Ni or Ni alloy so as to exhibit desirable resilience.

(1) First Contact Section:

The first contact section 10 has a bar-like shape. As shown in FIG. 1, the first contact section 10 is slanted at 0° to 10° toward the connecting section 12 on the basis of the central axis 18 of the interconnect device.

In addition, the tip 10*a* of the first contact section 10 is formed to be sharp in order to increase contact ability when the tip makes contact with the contact terminal in the space transformer.

(2) Connecting Section:

The connecting section 12 is connected to one end of the first contact section 10 in an integrated manner. Also, the connecting section 12 is made up of the same material as the first contact section 10 and has an O-ring-like shape of which one side is opened.

Figure 5:
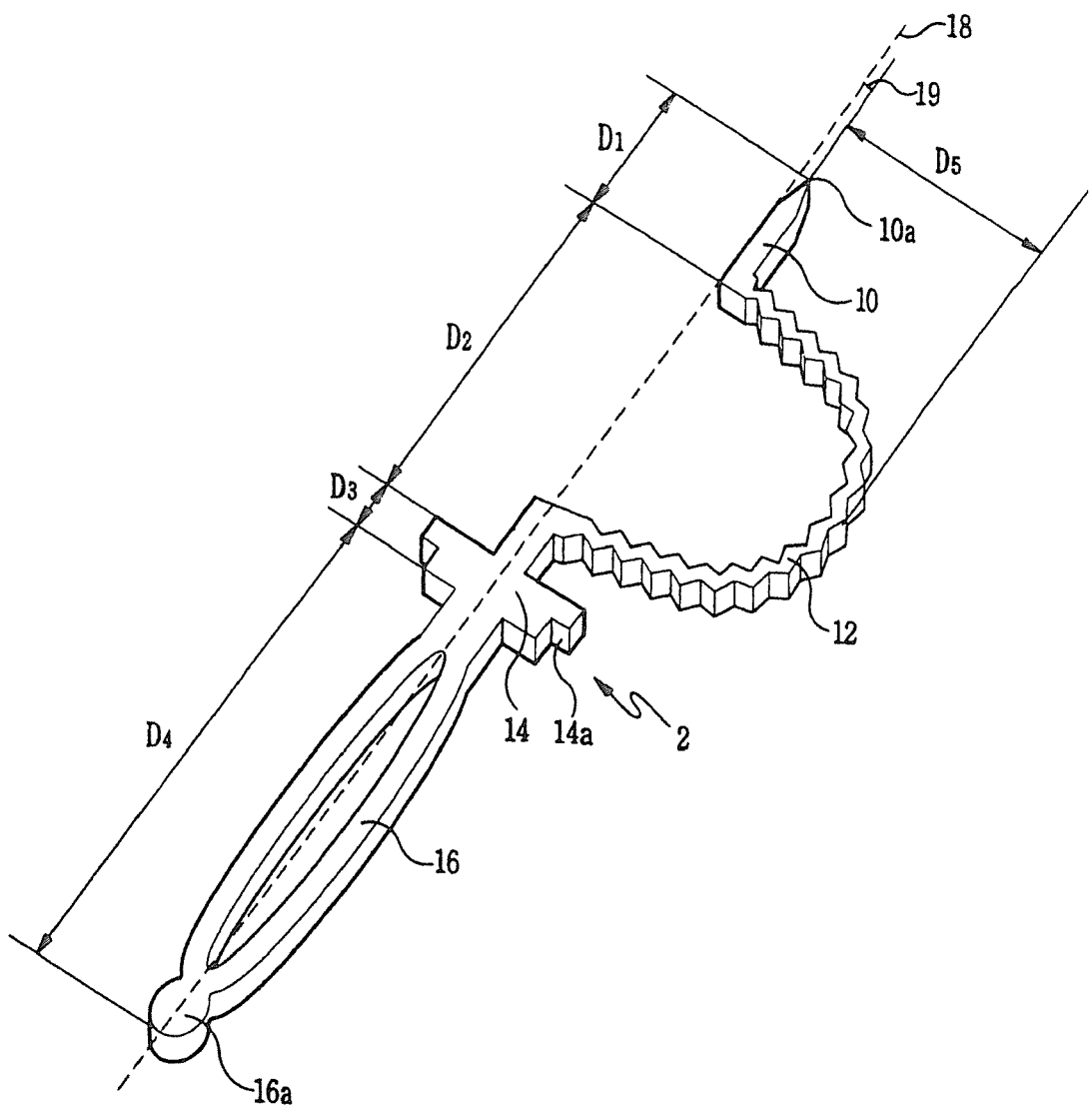
FIG. 5 is a perspective view of an interconnect device according to another embodiment of the present invention.

In addition, as recognized in FIG. 5, the connecting section 12 has a multi-bent spring-like shape.

(3) Support Section:

The support section 14 is connected to one end of the connecting section 12 in an integrated manner. Also, the support section 14 is made up of the same material as the connecting section 12 and has an engaging protrusion 14*a* in a predetermined portion as shown in FIG. 1.

(4) Second Contact Section:

The second contact section 16 is connected to one end of the support section 14 in an integrated manner. Also, the second contact section 16 is made up of the same material as the support section 14 and has an O-ring-like shape.

In addition, the second contact section 16 has a protruding portion 16*a* at its end as shown in FIG. 1.

According to another aspect of the present invention, a method of manufacturing an interconnect device for a printed circuit board comprises steps of: forming a protective film pattern on a sacrificial substrate for forming an interconnect device including a first contact section 10 having a bar-like shape for making contact with a second contact terminal 76 in a space transformer, a connecting section 12 having an O-ring-like shape of which one side is opened and connected to one end of the first contact section 10 in an integrated manner, a support section 14 having an engaging protrusion in a predetermined portion and connected to one end of the connecting section 12 in an integrated manner, and a second contact section 16 having an O-ring-like shape and connected to one end of the support section 14 in an integrated manner;

filling a conductive material 26 into the inside of the protective pattern 24; and removing the protective film pattern 24 and the sacrificial substrate 20 to finish the interconnect device.

Now, a method of manufacturing an interconnect device for a printed circuit board according to the present invention will be described in detail for each step.

(1) Step of Forming a Protective Film Pattern:

This step is to shape the interconnect device 2.

First, a seed layer 22 is formed on a sacrificial substrate 20. Then, the protective film pattern 24 is formed by coating a photo resist having a predetermined thickness on the seed layer and then performing exposure and development using a mask having the same shape as the interconnect device. In this case, the seed layer is made up of a material including Cu and formed by sputtering.

As a result of this step, the groove having the shape of the interconnect device is formed on the sacrificial substrate 20.

(2) Step of Filling a Conductive Material:

This step is to fill a conductive material into the groove on the protective film pattern 24 formed in the step of forming a protective film pattern.

In more detail, a conductive material 26 capable of exhibiting desirable resilience is filled into the groove in the protective film pattern having the shape of the interconnect device on the sacrificial substrate. In this case, a planarization process is performed after filling the conductive material 26 if the conductive material 26 is filled to excess the heights of other portions of the photo resist on the sacrificial substrate 20.

Also, the conductive material 26 is made up of a material including Ni or Ni alloy.

(3) Step of Finishing the Interconnect Device:

This step is to finish the interconnect device.

First, the protective film pattern 26 made up of a material such as a photo resist on the sacrificial substrate 20 is removed by wet etching or the like using a chemical material so that the conductive material 26 having the shape of the interconnect device is exposed on the sacrificial substrate 20.

Then, the seed layer 22 and the sacrificial substrate 20 are removed by wet etching or the like using a chemical material so that the interconnect device made up of a conductive material is finished.

According to still another aspect of the present invention, an interconnect assembly having an interconnect device for a printed circuit board comprises: a printed circuit board 40 including a contact hole 70 in which a conductive film 72 connected to an internal circuitry is formed on the inside wall; a first guide film 60 fixed on a bottom surface of the printed circuit board 40 and having a first guide opening 66 to open the contact hole 70; a space transformer having a second contact terminal 76 on a top portion and a bump 64 in the vicinity of the second contact terminal 76; a second guide film 62 fixed on the space transformer 52, supported by the bump 64, and having a second guide opening 68 to be related with the bump 64; and an interconnect device 2 including a second contact section having an O-ring-like shape to be inserted into the contact hole 70 by an interference fit, a support section having an engaging protrusion in a predetermined portion and connected to the second contact section in an integrated manner to be inserted into the inside of the first guide opening, a connecting section having an O-ring-like shape of which one side is opened and connected to the support section in an integrated manner thereby being placed between the first guide film and the second guide film, and a first contact section connected to the connecting section in an integrated manner for making contact with the second contact section 76 through the second guide opening.

Now, an interconnect assembly for a printed circuit board according to the present invention will be described in detail for each element.

(1) Printed Circuit Board:

The printed circuit board 40 includes a plurality of contact holes 70. A conductive film 72 made up of a conductive material is formed on the inside wall of each contact hole 70.

In addition, a first contact terminal 74 made up of a conductive material is formed in the peripheral portion of each contact hole 70 on the bottom surface of the printed circuit board 40. Also, a first guide film 60 is fixed on the bottom surface of the printed circuit board 40 having the first contact terminal 74 by using an attaching means such as an adhesive, and includes a plurality of first guide openings 66.

(2) Space Transformer:

The space transformer 52 is installed within a predetermined distance from the bottom surface of the printed circuit board 40. Also, the space transformer 52 includes a plurality of second contact terminals 76. In addition, a predetermined number of bumps 64 are included in the vicinity of the second contact terminal 76.

A second guide film having second guide openings 68 is fixed on the top portion of the bump by an attaching means such as an adhesive. In this case, the second guide film 62 is fixed in such a way that the second guide openings 68 are related with the second contact terminals 76.

(3) Interconnect Device:

Herein, it is preferable to use the interconnect device 2 manufactured according to the aforementioned manufacturing method.

In this case, the first contact section 10 of the interconnect device 2 makes contact with the second contact terminal 76, whereas the second contact section 16 makes contact with the contact hole 70 in the printed circuit board 40.

Figure 3:
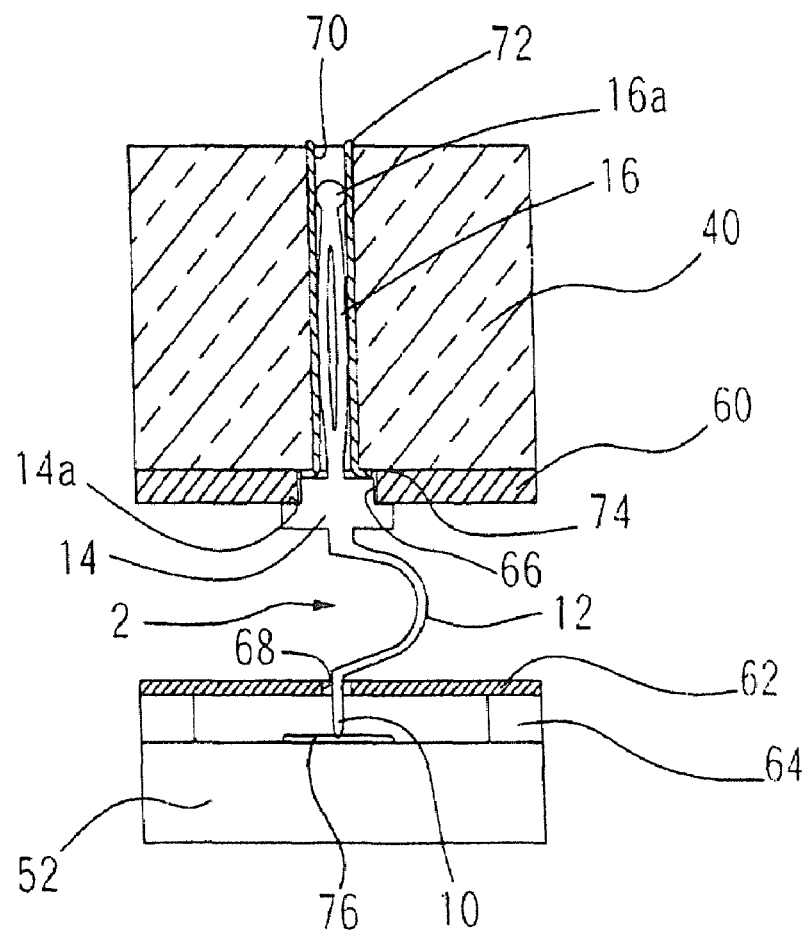
FIG. 3 is a cross sectional view for explaining an interconnect device according to an embodiment of the present invention.

(4) Other Elements:

As recognized in the FIG. 3, in the aforementioned interconnect assembly for a printed circuit board, the first and second reinforcement plates 42 and 46 are attached to the top and bottom surfaces of the printed circuit board 40, respectively. The first and second reinforcement plates 42 and 46 are fixed by the bolts 44.

In this case, the second reinforcement plate 46 is connected to the third reinforcement plate 48 attached to the space transformer 52 by the plate spring 50.

By means of the second reinforcement plate 46, a predetermined distance can be maintained between the printed circuit board 40 and the space transformer 52.

The first and second guide films are made up of a nonconductive polyimide material.

Now, the most preferred embodiment of the present invention will be described in detail with reference to the accompanying drawings.

FIG. 1 is a perspective view for explaining the interconnect device for a printed circuit board according to the most preferred embodiment of the present invention.

As shown in FIG. 1, the interconnect device 2 for a printed circuit board according to the present invention comprises the first contact section 10, the connecting section 12, the support section 14, the second contact section 16, and the protruding portion 16a in an integrated manner. The first contact section 10, the connecting section 12, the support section 14, the second contact section 16 and the protruding portion 16a are made up of a material having desirable resilience such as Ni—Co alloy.

Also, as recognized in FIG. 1, the first contact section 10 is slanted at 0° to 10° toward the connecting section 12 on the basis of the central axis 19 of the interconnect device. In this case, the tip 10a of the first contact section 10 having a bar-like shape is formed to be sharp so as to make contact with the contact terminal 76, and the first contact section 10 has a total length $D_1$ of about 1 mm.

In addition, the connecting section 12 is connected to the first contact section 10 in an integrated manner and has an O-ring-like shape of which one side is opened so as to be compressed or stretched by its resilient activity. Here, the connecting section 12 has a total length $D_2$ of about 2 to 3 mm.

In this case, the total length $D_5$ between the end of the first contact section 10 and the end of the center portion of the connecting section 12 is set to about 2 to 3 mm. Also, the connecting section 12 having an O-ring-like shape of which one side is opened may have a multi-bent structure so as to be compressed or stretched by its spring-like activity.

Moreover, the support section 14 is connected to one end of the connecting section 12 in an integrated manner and has the shape of a thin rectangular plate having an engaging protrusion 14a in its lower portion so as to be engaged with the hole. In this case, the support section 14 has a total length $D_3$ of about 0.5.

In addition, the second contact section 16 is connected to one end of the support section 14 in an integrated manner. Specifically, the second contact section 16 has a long hollow O-ring-like shape having a central opening in its internal portion and a protruding portion 16a in its end so that a resilient force can be exerted by physical forces generated on its sides when the second contact section is inserted into the contact hole 70. Also, the second contact section 16 has a total length $D_4$ of about 5 mm.

Figure 2A:
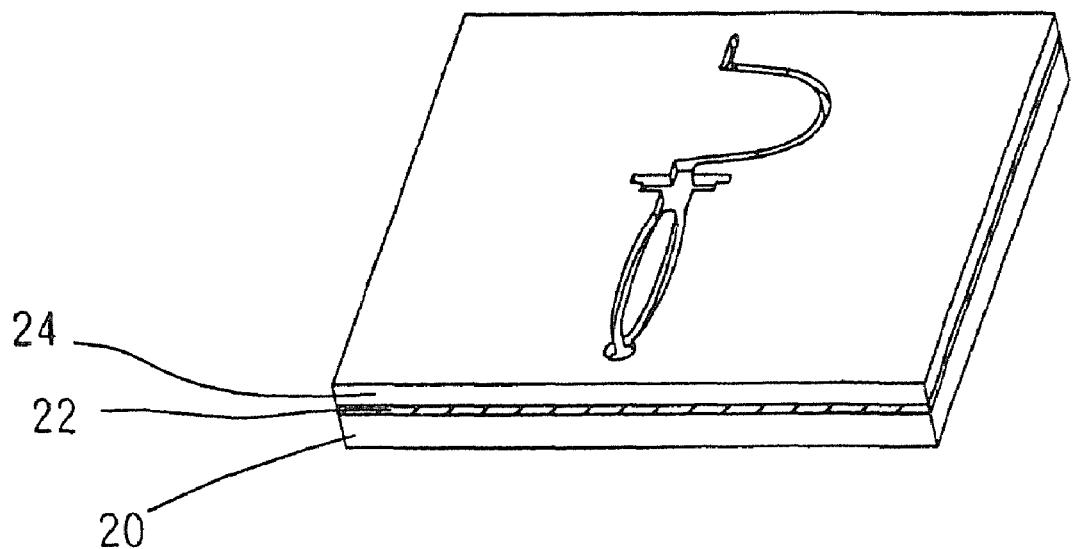
FIGS. 2*a*, 2*b*, and 2*c* are cross sectional views for explaining a method of manufacturing an interconnect device according to an embodiment of the present invention.
Figure 2B:
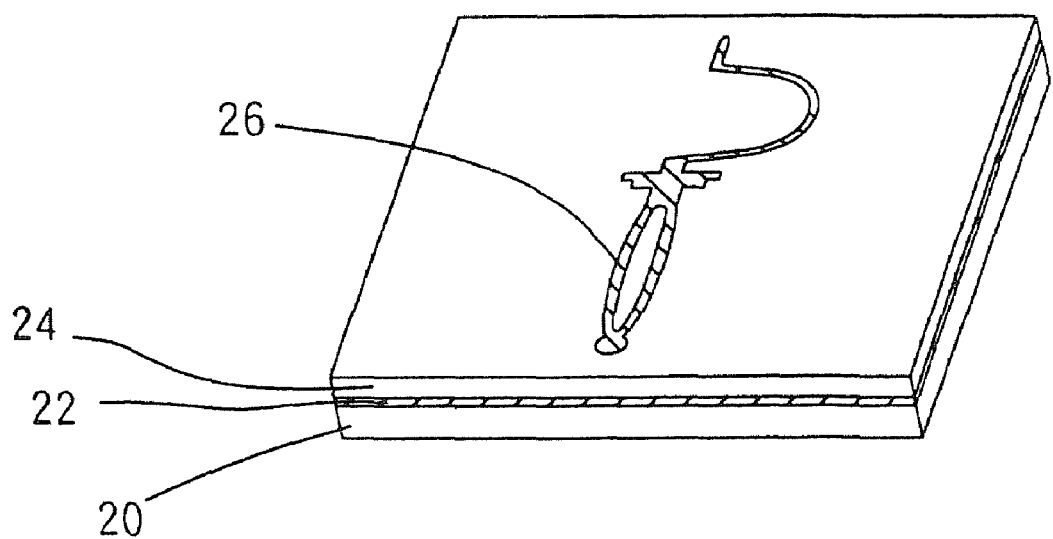
Figure 2C:
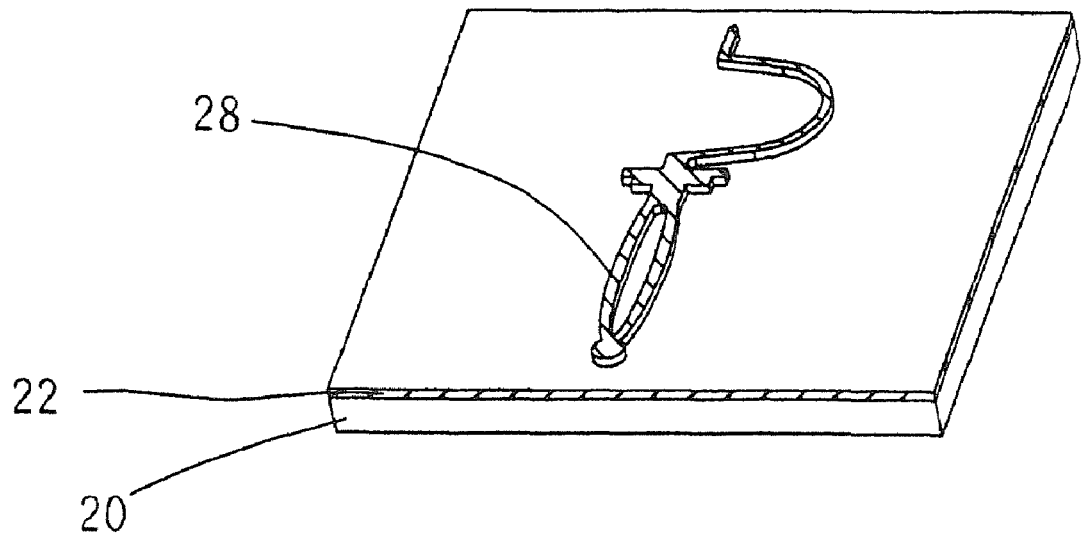

FIGS. 2a to 2c are the cross sectional views for explaining a method of manufacturing the interconnect device for a printed circuit board according to a preferred embodiment of the present invention.

Now, a method of manufacturing the interconnect device for a printed circuit board according to the most preferred embodiment of the present invention will be described in detail with reference to the accompanying drawings.

First, as shown in FIG. 2a, the sacrificial substrate 20 made up of silicon or the like is prepared and the seed layer 22 made up of a material including Cu or the like is formed on the sacrificial substrate 20 by a deposition process such as sputtering.

In addition, the protective film pattern 24 made up of a photo resist or the like is formed by coating the photo resist having a predetermined thickness on the seed layer 22 and then performing exposure and development using a mask for forming the interconnect device 2 having the shape shown in FIG. 1. In this case, the photo resist has a thickness of 100 to 200 μm. Most preferably, the photo resist has a thickness of 140 μm.

Next, as shown in FIG. 2b, the groove on the protective film pattern formed on the sacrificial substrate 20 is filled with a conductive material 26 such as Ni or Ni alloy, e.g., Ni—Co or Ni—W—Co which can exhibit desirable resilience, and then the top surface of the sacrificial substrate 20 is planarized.

In this case, chemical mechanical polishing (CMP) or grinding can be used for the planarization process. However, the planarization process can be omitted when the plating process is ideally performed so that only the inside of the opening portion of the protective film pattern 24 is filled with a conductive material 26.

Particularly, the preceded step of forming the seed layer 22 can be omitted when the conductive material 26 is deposited by other methods such as physical vapor deposition (PVD) or chemical vapor deposition (CVD) instead of the plating process.

Then, as shown in FIG. 2c, the protective film pattern 24 made up of a photo resist or the like on the sacrificial substrate 20 is removed by wet etching or the like using a chemical material so that the conductive material 26 is exposed on the sacrificial substrate 20. Accordingly, the interconnect device 28 shown in FIG. 1 is exposed on the sacrificial substrate 20.

Subsequently, the interconnect device 28 for a printed circuit board is finished by removing the seed layer 22 and the sacrificial substrate 20 by wet etching or the like using a chemical material.

As a result, the interconnect device 28 for a printed circuit board has excellent reproducibility and productivity because a semiconductor manufacturing technique is used.

Figure 4:
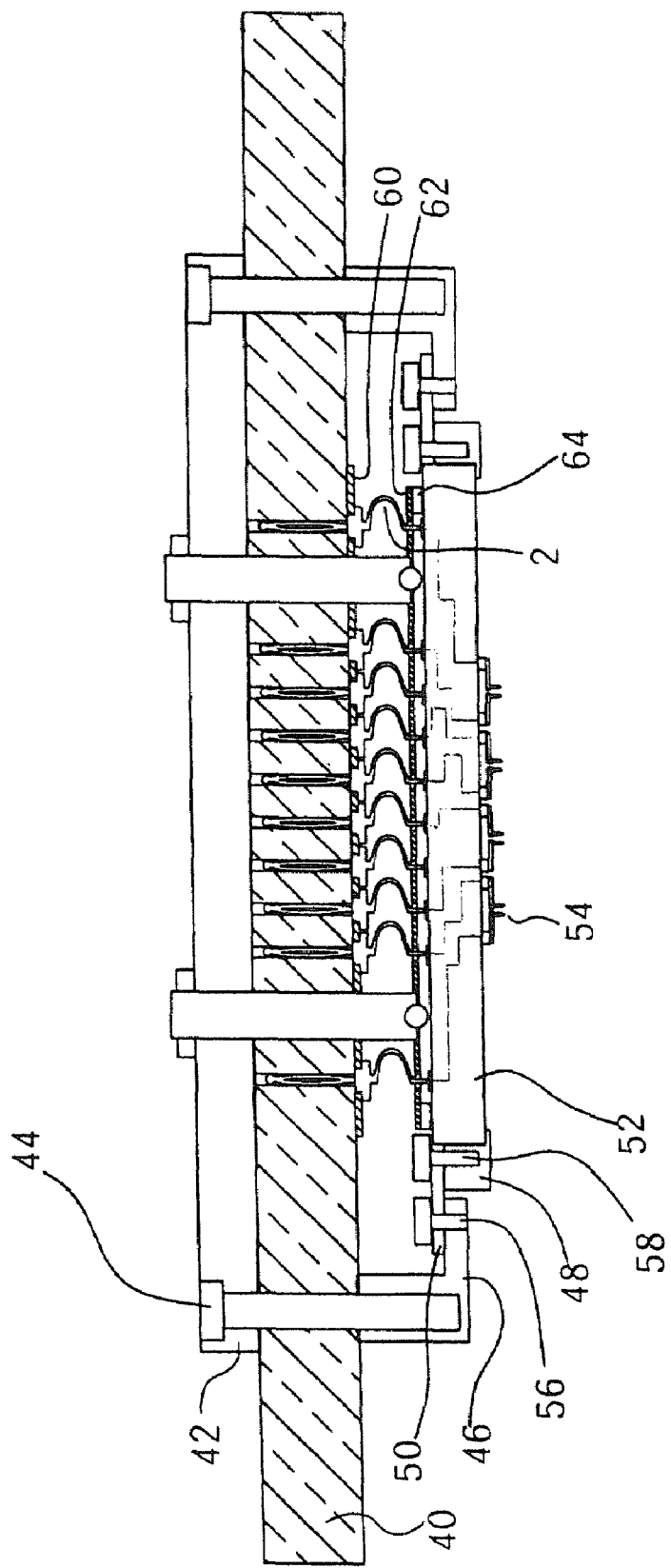
FIG. 4 is a cross sectional view for explaining the assembled relation of the interconnect devices shown in FIG. 3 in more detail.

FIG. 3 is a cross sectional view for explaining an assembly including the interconnect device 2 for a printed circuit board according to the most preferred embodiment of the present invention, and FIG. 4 is a cross sectional view for explaining the assembled relation of the interconnect device 2 shown in FIG. 3 in more detail.

As shown in FIGS. 3 and 4, the assembly including the interconnect device for a printed circuit board according to the present invention, that is, a probe card has such a structure that the space transformer 52 having a plurality of probes 54 attached on the bottom surface for a direct contact with the probed and the printed circuit board 40 having a plurality of contact holes 70 connected to the internal circuit are electrically connected via the aforementioned interconnect device 2 by means of several subsidiary elements such as the first reinforcement plate 42, the second reinforcement plate 46, the third reinforcement plate 48, the plate spring 50, and the bolts 44, 50, and 58.

Now, the relation between the printed circuit board 40 and the space transformer 52 which are assembled by the interconnect devices will be described with reference to FIG. 4.

The printed circuit board 40 comprises a plurality of contact holes 70 in which the conductive films 72 including a conductive material such as Cu are formed on their inside walls so as to be connected to the internal circuitry. Also, the first contact terminals 74 made up of a conductive material such as Cu are included in the peripheral portions of the contact holes 70 on the bottom surface of the printed circuit board 40.

In addition, the first guide film 60 having a plurality of first guide openings 66 is fixed on the bottom surface of the printed circuit board 40 by using an attaching means such as an adhesive.

In this case, the first guide openings 66 on the first guide film 60 are formed to entirely open the contact holes 70 and the first contact terminals 74, and the diameter of the first guide opening 66 is made to be larger than that of the contact hole 70.

This is because the first guide opening 66 plays a role in guiding the second contact section 16 of the interconnect device into the inside of the contact hole 70. In other words, the first guide opening 66 allows the second contact section 16 of the interconnect device 2 to be precisely inserted into the inside of the contact hole 70 even if the location of the contact hole 70 is somewhat deviated by imperceptible errors in the manufacturing process.

In addition, the space transformer 52 having a plurality of second contact terminals 76 is placed within a predetermined distance from the bottom surface of the printed circuit board 40, and bumps are disposed in the vicinity of the second contact terminal 76.

Herein, the second guide film 62 having the second guide openings 68 is fixed on the bumps 64 by using an attaching means such as an adhesive. The second guide film 62 is fixed to relate the second guide opening 68 with the second contact terminal 76.

In addition, as shown in FIG. 1, the second contact section 16 of the interconnect device 2 is inserted into the inside of the contact hole 70.

In this case, since the second contact section 16 of the interconnect device 2 has a long hollow O-ring-like shape which causes resilience, the second contact section 16 is tightened when it is inserted into the inside of the contact hole 70 from the protruding portion 16a by an interference fit, whereby it can make strong contact with the conductive film 72 in the inside of the contact hole 70 by its resilient force. The interference fit means a method of forcibly inserting the second contact section having a diameter greater than the contact hole 70 into the contact hole 70 by external forces.

Then, the engaging protrusion 14a of the support section 14 makes contact with the first contact terminal 74 in the peripheral portion of the contact hole 70 when the second contact section 16 is fully inserted into the contact hole 70.

Also, the connecting section 12 is placed in the gap between the printed circuit board 40 and the space transformer 52. The first contact section 10 makes contact with the second contact terminal 76 under the guidance by the second guide opening 68 included in the aforementioned second guide film 62.

In this case, the second contact terminal 76 makes contact with the first contact section 10 when the space transformer 52 is engaged with the printed circuit board 40 by using the third reinforcement plate 48, the bolts, and the like after the interconnect device 2 is inserted into the contact hole 70 in the printed circuit board 40.

Particularly, since the first contact section 10 of the interconnect device is slanted at 0° to 10° toward the connecting section on the basis of the central axis 18 of the interconnect device, the tip 10a of the first contact section 10 can make accurate contact with the second contact terminal 76 even if the connecting section 12 is somewhat bent by external forces and the position of the first contact section 10 is somewhat deviated when the first contact section 10 makes contact with the second contact terminal 76 through the guide opening 68.

INDUSTRIAL AVAILABILITY

According to the present invention, the printed circuit board is electrically connected to the space transformer just by inserting the interconnect devices into the insides of the contact holes on the printed circuit board. Therefore, it is possible to solve the conventional problems such as difficulties in the manufacturing process accompanied by the bonding process.

Particularly, it is possible to originally prevent occurrence of electrical noises generated by the deterioration of the bonding portions because there is no bonding portions by omitting a bonding process.

In addition, it is possible to reduce the cost of manufacturing a probe card assembly by omitting the conventional interposers and adapting the interconnect devices produced by a MEMS process.

Furthermore, it is possible to manufacture constant quality of products in a large number and ensure high reproducibility because the interconnect devices are manufactured by a micro electro mechanical system (MEMS) process.

Although the present invention and its advantages have been described in detail, it should be understood that the present invention is not limit to the aforementioned embodiment and the accompanying drawings and it should be understood that various changes, substitutions and alterations can be made herein by the skilled in the arts without departing from the spirit and the scope of the present invention as defined by the appended claims.

What is claimed is:

1. An interconnect assembly including an interconnect device for a printed circuit board, comprising:
    a printed circuit board including a contact hole in which a conductive film connected to an internal circuitry is formed on its inside wall;
    a first guide film fixed on a bottom surface of the printed circuit board and having a first guide opening to open the contact hole;
    a space transformer having a second contact terminal on a top portion and a bump in the vicinity the second contact terminal;
    a second guide film fixed on the space transformer, supported by the bump, and having a second guide opening to be related with the bump; and
    an interconnect device including a second contact section having an O-ring-like shape to be inserted into the contact hole by an interference fit, a support section having an engaging protrusion in a predetermined portion and connected to the second contact section in an integrated manner to be inserted into the inside of the first guide opening, a connecting section having an O-ring-like shape of which one side is opened and connected to the support section in an integrated manner thereby being placed between the first guide film and the second guide film, and a first contact section connected to the connecting section in an integrated manner for making contact with the second contact section through the second guide opening.

2. The interconnect assembly including an interconnect device for a printed circuit board according to claim 1, wherein the interconnect assembly further comprises a first contact terminal connected to the conductive film around the contact hole on a bottom surface of the printed circuit board, and the first guide opening is formed to open the contact hole and the first contact terminal around the contact hole.

3. The interconnect assembly including an interconnect device for a printed circuit board according to claim 2, wherein the interconnect device is installed by inserting the second contact section 16 into the inside of the contact hole so that the engaging protrusion makes contact with the first contact terminal.

4. The interconnect assembly including an interconnect device for a printed circuit board according to claim 1 or 2, wherein the connecting section has a multi-bent shape.

5. The interconnect assembly including an interconnect device for a printed circuit board according to claim 1 or 2, wherein the first and the second guide films are made up of a non-conductive polyimide material.

* * * * *